United States Patent
Bour et al.

[11] Patent Number: 5,982,799
[45] Date of Patent: *Nov. 9, 1999

[54] MULTIPLE-WAVELENGTH LASER DIODE ARRAY USING QUANTUM WELL BAND FILLING

[75] Inventors: David P. Bour; Ross D. Bringans, both of Cupertino, Calif.

[73] Assignee: Xerox Corporation, Stamford, Conn.

[*] Notice: This patent issued on a continued prosecution application filed under 37 CFR 1.53(d), and is subject to the twenty year patent term provisions of 35 U.S.C. 154(a)(2).

[21] Appl. No.: 08/818,264

[22] Filed: Mar. 17, 1997

Related U.S. Application Data

[63] Continuation of application No. 08/306,038, Sep. 14, 1994, abandoned.

[51] Int. Cl.⁶ .................................................. H01S 3/19
[52] U.S. Cl. .................................................. 372/50; 372/23
[58] Field of Search .................................. 372/50, 23, 97; 257/89

[56] References Cited

U.S. PATENT DOCUMENTS

| | | | |
|---|---|---|---|
| 4,831,629 | 5/1989 | Paoli et al. | 372/50 |
| 4,993,036 | 2/1991 | Ikeda et al. | 372/23 |
| 5,396,508 | 3/1995 | Bour et al. | 372/50 |
| 5,608,716 | 3/1997 | Koyama et al. | 372/50 |

FOREIGN PATENT DOCUMENTS

| | | | |
|---|---|---|---|
| 0141191 | 6/1986 | Japan | 372/50 |
| 62-196886 | 8/1987 | Japan | 372/50 |
| 62-234389 | 10/1987 | Japan | 372/50 |
| 0270284 | 10/1989 | Japan | 372/43 |
| 1-273378 | 11/1989 | Japan | 372/50 |
| 0058883 | 2/1990 | Japan | 372/46 |
| 2-71573 | 3/1990 | Japan | 372/50 |
| 5090699 | 4/1993 | Japan | 372/49 |
| 5110187 | 4/1993 | Japan | 372/50 |
| 6-132610 | 5/1994 | Japan | 372/50 |

OTHER PUBLICATIONS

D.P. Bour and G.A. Evans, Lateral Mode Discrimination in AlGaInP Selectively Buried Ridge Waveguide Lasers, IEE Proceeding–J, vol. 139, No. 1, Feb. 1992.

Stephen R. Chinn, Peter S. Zory and Axel R. Reisenger, A Model for GRIN–SCH–SQW Diode Lasers, Journal of Quantum Electroncs, vol. 24, No. II, Nov. 1988, pp. 2191–2214.

Yasunori Tokuda, Yuji Abe, Teruhito Matsui, Noriaki Tsukada and Takashi Nakayama, Dual–Wavelength Emission from a Twin–Stripe Single Quantum Well Laser, Appl. Phys. Lett 51(21), Nov. 23 1987, pp. 1664–1666.

*Primary Examiner*—Rodney Bovernick
*Assistant Examiner*—Quyen Phan Leung
*Attorney, Agent, or Firm*—Oliff & Berridge, PLC

[57] ABSTRACT

A multiple-wavelength laser diode array is described. A wavelength span of several tens of nanometers is achieved through band-filling of a quantum well active region. A multiple-wavelength array is formed by selectively introducing different amounts of optical loss into the array elements, to affect the threshold current density. With minimum losses, the laser oscillates at a long wavelength, while an element with high loss will undergo more bandfilling and be forced to emit at a shorter wavelength. To illustrate the structures which incorporate these additional, selective losses, a 2-red-wavelength AlGaInP laser array is described. In preferred embodiments, increased optical loss is achieved in an SBR type laser by narrowing the ridge region, or by reducing its thickness. In another type of laser, increased optical loss is achieved by a very thin upper cladding layer causing increased optical absorption in a close overlying cap or metal layer.

13 Claims, 4 Drawing Sheets

MULTIPLE-WAVELENGTH LASER DIODE ARRAY USING QUANTUM WELL BAND FILLING

This application is a continuation of application Ser. No. 08/306,038, filed Sep. 14, 1994, now abandoned.

RELATED APPLICATIONS

Commonly assigned patent application Ser. No. 08/158,250, filed Nov. 29, 1993, now abandoned entitled "Multiple Wavelength, Dual Polarization Laser Diode Arrays" in the names of: D. Bour, K. Beernink and R. Thornton (XRX-142).

BACKGROUND OF THE INVENTION

This invention relates to multiple-wavelength laser diode arrays having quantum well (QW) active regions.

For a laser diode with a quantum well (QW) active region, the wavelength ($\lambda$) is dependent upon the threshold current density ($\sigma$), as shown in FIG. 1. See for example, Chinn et al., IEEE Journal of Quantum Electronics, 24, 2191 (1988) whose contents are herein incorporated by reference. Basically, as the threshold gain increases, the threshold carrier density (and therefore the threshold current) must also increase corresponding to greater filling of the states in the conduction band and the valence band. Therefore, at higher carrier densities, the spectral range over which the gain is positive extends out to higher energies. And due to the gain's spectral broadening (associated with intraband carrier scattering), the gain peak shifts with the QW carrier density to higher energy (shorter wavelength). Furthermore, when the bands fill enough so that the n=2 state begins to deliver gain, the gain at the n=2 transition wavelength can be greater than that at the n=1 (ground state) transition wavelength. This is so because the n=1 state provides gain at the (shorter) n=2 transition wavelength, which adds to the gain provided by the n=2 transition.

This bandfilling up to the n=2 state, can then lead to interesting behavior. As the gain peak blue-shifts continuously with higher carrier densities, it can additionally undergo a large and discontinuous blue-shift. Such a large shift is associated with a shift from the n=1 transition to the n=2 transition.

There is an important need in the art for a multiple wavelength laser diode array providing closely-spaced laser-emitting spots but of different wavelengths that can be optically separated, as in the optical system of certain printers. Multiple-element laser diode arrays are being developed for color and highlight-color xerography. For these applications, the emission from individual elements of the array must be easily and entirely separable, for instance through cross-polarizations or different wavelengths. Different schemes have been proposed to achieve such a structure. One such scheme using band-filling is described in Appl. Phys. Lett, 51 (21), Nov. 23, 1987, 1664–1666. In the scheme described in this publication, a graded-index waveguide separate-confinement heterostructure (GRIN SCH) comprises active regions of a single quantum well (QW) of GaAs divided into twin stripes by waveguide sections formed by Zn impurity-induced disordering. The stripes have different widths, and the generated photons spread into the Zn-disordered regions to different degrees. The high concentration of the Zn acceptors and free holes scatters the photons and thus subjects the lasing stripes of different width to different degrees of losses. As explained in the publication, one stripe can thus be caused to lase at the n=1 transition, and due to band filling, the other (narrower) stripe can be caused to lase at the n=2 transition at a shorter wavelength.

Certain disadvantages are experienced with the scheme described in the publication. One disadvantage is that it is not applicable to other kinds of diode laser geometries, such as a selectively buried ridge (SBR) waveguide laser. Secondly, the loss mechanism described for the effect desired is excessive. As noted in the publication, the threshold current for both lasers was excessive. Thirdly, no explanation is given in the publication how to apply the described scheme to a different material system, specifically the AlGaInP system which lases at wavelengths that are particularly desirable for certain printing applications.

SUMMARY OF THE INVENTION

An object of the invention is an improved multiple wavelength diode laser array.

A further object of the invention is a multiple wavelength diode laser array exhibiting lower threshold current.

Another object of the invention is a multiple wavelength diode laser array of the SBR type.

Still a further object of the invention is a multiple wavelength diode laser array in the AlGaInP material system.

BRIEF SUMMARY OF THE INVENTION

A multiple-wavelength laser diode array is described having a wavelength span of several tens of nanometers, e.g., from 10–50 nm, whose total wavelength separation is achieved through band-filling of a quantum well active region. A multiple-wavelength array is formed by selectively introducing different amounts of optical loss in a controlled manner into the array elements, to affect the threshold current density. With minimum losses, the laser oscillates at a long wavelength, while an element with higher loss will undergo more bandfilling and be forced to emit at a shorter wavelength. In accordance with a preferred embodiment of the invention, the structures which incorporate these additional, selective losses comprise a 2-red-wavelength AlGaInP laser array.

In such structures, the strong ridge-width and ridge-depth dependence of the fundamental mode loss can be used to shift the lasing wavelength through bandfilling. Generally, if the threshold carrier density is made larger, the lasing wavelength will be blue-shifted. A preferred embodiment of the invention is a diode laser array of the SBR type. The latter has the advantages that the technology to make such devices is very advanced and reliable, the SBR technology can readily be applied to many different material systems, and introducing the controlled loss to shift the operating wavelength does not involve a serious sacrifice in threshold current.

In a further preferred embodiment of the invention, a laser array comprises side-by-side ridge lasers. One of the lasers has a higher threshold gain, for example an AlGaInP SBR with either a narrow stripe width or a shallower ridge, and is forced to emit at a shorter wavelength. Multiple-wavelength arrays can therefore be formed by varying either or both the stripe width and/or the ridge depth along the array.

In accordance with a further aspect of the present invention, the different losses are introduced by varying the total thickness of the upper cladding layer. In a preferred embodiment in accordance with this aspect of the invention, the longer wavelength laser has a relatively thicker cladding layer than that of its neighbor. Preferably, the cladding layer of the short wavelength laser is less than about 0.6 μm. As a result, the laser with the thinner cladding layer exhibits higher optical absorption arising from the closer contact layer which raises its threshold and blue-shifts its wavelength.

These and other objects and attainments together with a fuller understanding of the invention will become apparent and appreciated by referring to the following descriptions and claims taken in conjunction with the accompanying drawings which illustrate by way of example and not limitation preferred embodiments of the invention and wherein like reference numerals denote like or corresponding parts.

DETAILED DESCRIPTION OF PREFERRED EMBODIMENTS

Figure 1:
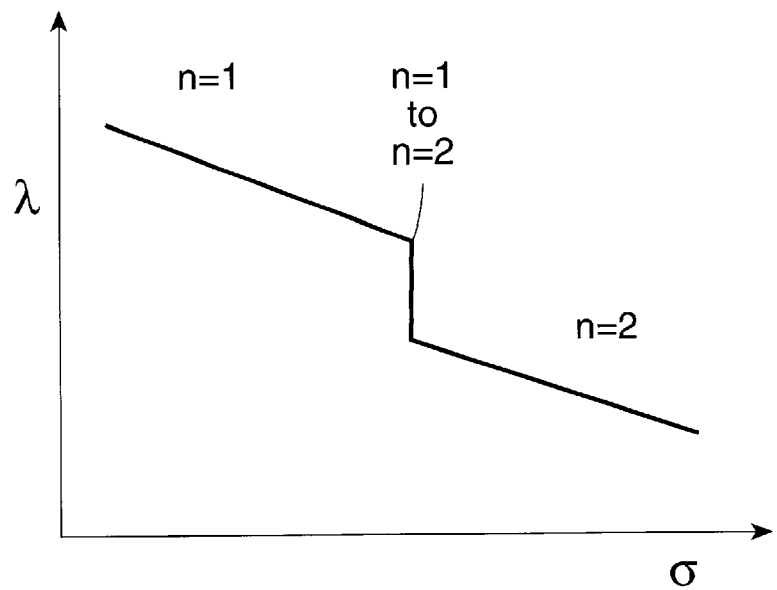
FIG. 1 is a graph plotting the QW carrier-density (σ) dependence of lasing wavelength (λ)
Figure 2:
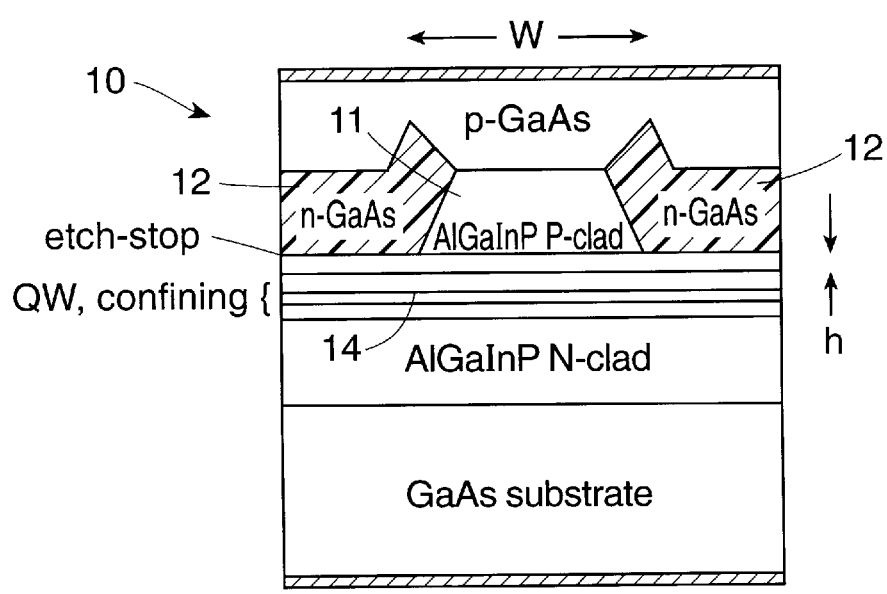
FIG. 2 is a cross-sectional view of a typical AlGaInP selectively buried ridge (SBR) waveguide laser diode.
Figure 3:
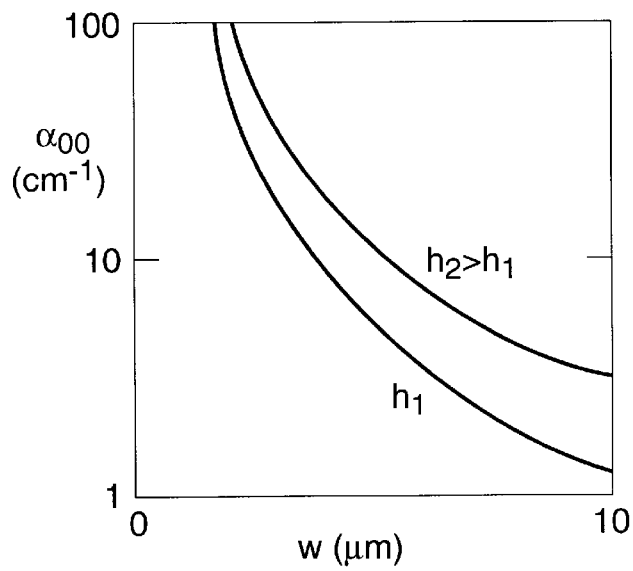
FIG. 3 is a graph showing the stripe-width(w) dependence of fundamental mode loss ($\alpha_{00}$) in a AlGaInP selectively buried ridge (SBR) waveguide laser, for two ridge depths $h_1$ (about 100 nm) and $h_2$ (about 200 nm)

For visible AlGaInP laser diodes, the standard index-guide is the selectively buried ridge (SBR) waveguide laser 10, illustrated in FIG. 2. See, for example, Bour et al., IEE Proceedings-J, Vol. 139, No. 1, February 1992, pgs. 71–74, whose contents are herein incorporated by reference. This structure is basically a ridge waveguide 11, with n-type GaAs (shaded) regrown wings 12 around the ridge 11. This n-GaAs 12 serves as a current blocker (confining current to the stripe 11). In addition, it introduces an optical loss (α) which selectively suppresses the oscillation of high-order modes of the lateral ridge waveguide. The loss experienced by the fundamental mode is a strong function of the ridge width (w), the lateral spacing of the ridge waveguide 11 at its line junction nearest to the active region 14. In addition, over a certain range of ridge depths, this loss also becomes smaller when the GaAs regrowth interface is closer to the active region (for small dimension h). FIG. 3 shows the stripe-width (w) dependence of fundamental mode loss ($\alpha_{00}$) in a AlGaInP selectively buried ridge (SBR) waveguide laser, for two ridge depths $h_1$ (about 100 nm) and $h_2$ (about 200 nm). For smaller h, the lateral index guiding becomes stronger, reducing the spatial overlap with the wing regions, and thus reducing the modal loss.

The constructions of the invention take advantage of the SBR laser diode arrangement to provide side-by-side lasers in the same semiconductor body lasing, respectively, in wavelengths ($\lambda_1$) and ($\lambda_2$) that differ by at least 10–50 nm. Such lasers according to the invention are preferably constructed in the AlGaInP system to provide dual red light beams exhibiting acceptably low threshold currents. Moreover, novel methods for making such laser arrays are also described hereinafter.

Figure 4:
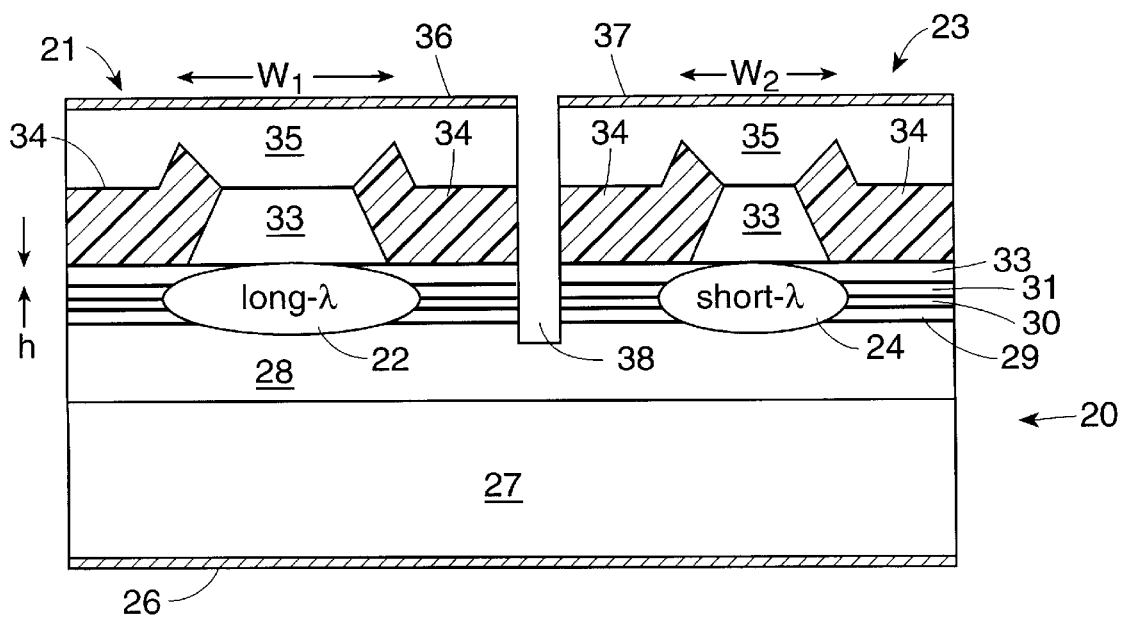
FIG. 4 is a cross-sectional view of one form of multiple wavelength laser according to the invention.

FIG. 4 shows an example of a two-red-wavelength AlGaInP SBR laser diode array formed by changing the stripe width. One element of the array on the left, has a wide stripe, while the other on the right, has a narrower stripe. The narrow-stripe laser is more lossy, so that its threshold carrier density is elevated and its emission is blue-shifted with respect to the wider stripe laser. The remaining parts of the array are similar to that of FIG. 2 and comprise, as an example, an n-metal contact 26, n-GaAs substrate 27, a thin GaAs/GaInP buffer (not shown), n-AlGaInP lower cladding 28, an AlGaInP lower confining (barrier) layer 29, an AlGaInP active layer 30, an AlGaInP upper confining layer 31, a p-AlGaInP upper cladding 33, two flanking regrown n-GaAs blocking and guiding regions 34 for each stripe, a cap of p-GaAs 35, and separate p-metal contacts 36 and 37. A slot 38 optically and electrically isolates the lasing regions 22, 24.

The amount by which the wavelength can be blue-shifted by bandfilling is on the order of a few tens of nanometers. Thus, the largest possible wavelength difference among the elements in a two-red-laser array could be made large enough to meet the minimum requirements for printing (which presently requires about 50 nm separation, for easily distinguished beams). For best performance in a dual-red AlGaInP array, it would be best to start with a long-wavelength, 700–720 nm device with a deep, thin, biaxially-compressed QW 30. This would be the simplest structure to achieve maximum blue shifts from bandfilling because: 1) it gives the largest energy separation between the n=1 and n−2 transitions; and 2) a biaxially compressed QW maximizes the blue-shifting as the bands fill. A 50 nm blueshift pushes the wavelength down to 650–670 nm, where electron leakage is still not a serious problem. Thus, an array whose wavelengths are approximately 660 and 710 nm are the best-performing. To achieve this operation, the ridge depths, h, are for example 100–400 nm, and the ridge widths ($W_1$ and $W_2$) can be, for example, 4 and 7 μm, respectively.

Figure 5:
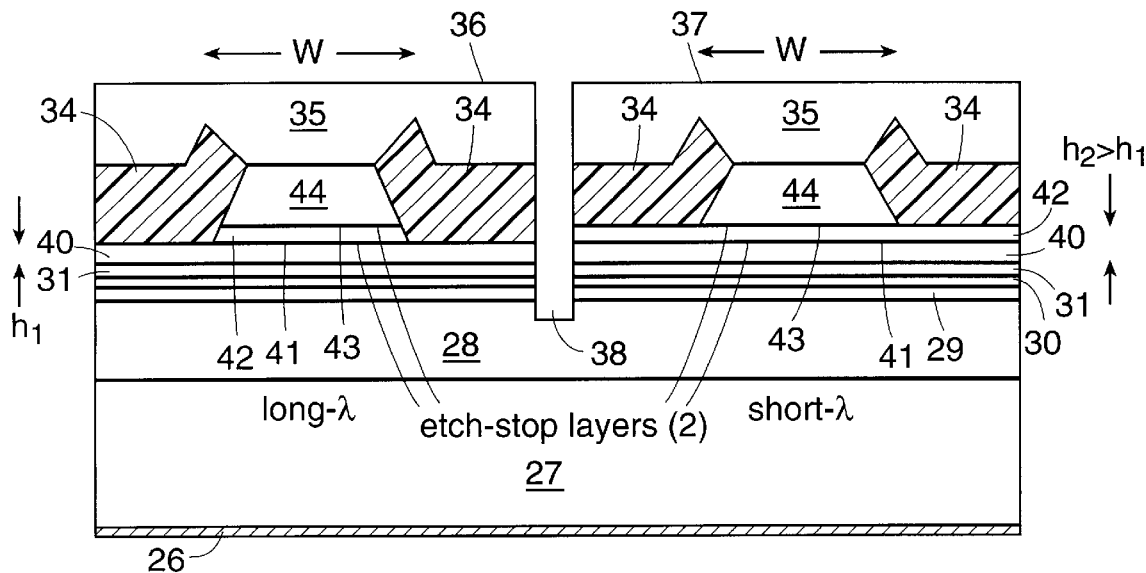
FIG. 5 is a cross-sectional view of another form of multiple wavelength laser according to the invention.

Another example according to the invention of a two-red-wavelength array is shown in FIG. 5, an AlGaInP SBR laser diode array in which the ridge width (w) is the same but the different wavelengths are obtained by changing the ridge depth. As used herein, h, in FIG. 5, is measured from the level of the upper confining layer 31 to the bottom of the wing regions 34. Hence, an increase in h means that the wing regions 34 are not as deep and thus the ridge 44 is shallower. The shallow-ridge laser on the right ($h_2$ is larger) is lossier, so that its threshold carrier density is elevated and its emission is blue-shifted with respect to the deeper ridge on the right ($h_1$ is smaller). This configuration has certain advantages compared to the ridge-width variation (FIG. 4), since it is a simple matter to make the beam parameters (divergence, near-field spot size, astigmatism, etc.) similar for the two side-by-side devices. On the other hand, when the ridge width (w) is varied as in the FIG. 4 embodiment, the mode size must also follow, and therefore the lateral beam divergence will be different for the two lasers. This could complicate the array's incorporation into a printer's optical system.

So far, we have described a multiple-wavelength laser diode array, based upon the bandfilling effect associated with thin quantum well active regions. In AlGaInP red, selectively buried ridge, waveguide lasers, a nominally 710 nm laser's emission could be blue-shifted by either decreasing the ridge width or adjusting the ridge depth. In this manner, a two-red-wavelength array could be formed, with one wavelength 710 nm and the other element's wavelength shorter by a few tens of nanometers.

For a deep, thin QW, where the confined states are widely separated in energy, the range of continuous gain-peak tuning (with carrier density) can be large. Alternatively, a thicker, less deep QW is more prone to discontinuous shifts, since in this case the energy level spacings are less. In either case, the ultimate limit of the wavelength range is further determined by the maximum allowable threshold current density. Higher threshold current density will always translate into shorter wavelengths, until heating (which offsets bandfilling) becomes significant, or until the threshold becomes so high as to prevent cw operation.

The FIG. 5 embodiment also offers an important advantage in the fabrication process to obtain ridges of different depths. This is achieved using two etch-stop layers of different compositions and at different depths. After the sandwich of active region 30 and flanking confinement layers 29, 31 have been epitaxially grown, a first thin upper cladding layer 40 (of p-AlGaInP), about 100–300 nm thin is epitaxially grown, followed by epitaxially growing a first lower etch-stop layer 41, in turn followed by epitaxially growing a second thin upper cladding layer 42 about 100–200 nm thin (of p-AlGaInP), in turn followed by epitaxially growing a second upper etch-stop layer 43, and finally epitaxially growing the remainder 44 of the upper cladding layer (of p-AlGaInP). The lower etch-stop layer 41 has a composition that etches relatively slow in certain etchants in comparison with the etch rate of AlGaInP in the same etchants. Dilute hydrochloric or hydrobromic acids are suitable examples of such etchants and GaInP and AlGaAs are examples of the lower etch stop composition. The object in the fabrication of such SBR structures is to mask off the right short-λ laser, and the ridge areas 42, 44 of the left long-λ laser, and then etch recesses down to or within 200 nm or less of the upper confinement layer 31. To reach that level at the left laser, the second upper etch stop composition must also be reasonably attacked by the etchant and thus does not function as an etch stop for the first etchant though the lower etch stop must. Next, the left laser is masked off as is and the ridge 44 of the right laser, and an etchant used to remove the AlGaInP regions to the left and right of the ridge down to the upper etch stop layer 43. For this purpose, the etch stop composition can be of GaInP and will function as an etch stop for an etchant such as dilute HCl or HBr.

As an alternative process, both ridges 44 are masked off and the wing areas down to the upper etch stop 43 removed using an etchant such as dilute HCl or HBr. Next, the right short-λ laser is masked off, as well as the left ridge 44, and the exposed upper etch stop 43 on the left subjected to processing to remove it, such as by 5 $H_2SO_4$:$H_2O_2$:$H_2O$ for an AlGaAs etch stop. Then using the same etchant as before, the etching of the AlGaInP on the left is continued until the lower etch stop 41 is reached, thus forming deeper recessed wing regions at the left. For this process, the etch stop compositions of both layers 41, 43 could be the same, for example, of AlGaAs, and the etchant of 5 $H_2SO_4$:$H_2O_2$:$H_2O$. Afterwards, the regrown GaAs wing regions 34 are regrown in the conventional manner. All of the layers described are single crystal layers formed epitaxially by well known methods such as MBE or OMVPE.

The scheme used in the present invention is preferably applied as noted above to SBR structures. In this structure, GaAs is regrown around the ridge in order to create a lateral waveguide. The GaAs is a relatively high-index material, and is grown close to the active region in the wings. This causes light to "leak" from the laser active region into the overlying GaAs. The properties of such a leaky mode are that it is reduced in index compared to the mode in the stripe region, thereby creating a lateral waveguide to confine light to the stripe. In addition, since the leaky mode (in the wing region) is radiating power into the GaAs, the regrown GaAs represents a large optical loss, strictly speaking, an outcoupling loss. And, the modal loss is greatest for a narrow stripe, since the evanescent tail of the mode has a greater overlap with the wing region for a narrow stripe. Consequently, the wavelength of the narrow-stripe laser (FIG. 4) is shorter than for a wide-stripe (again, due to bandfilling). Thus, a different optical loss mechanism is relied on in the invention in comparison with the structure described in the referenced Appl. Phys. Lett. publication, and the advantages over the Zn impurity-induced lateral index guided structure described in that publication have already been set forth above.

Figure 6:
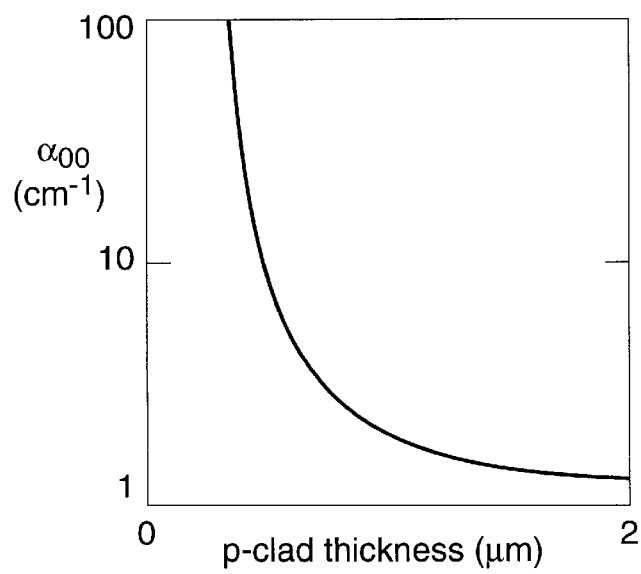
FIG. 6 is a graph showing the modal loss as a function of the upper cladding layer thickness.

It turns out that the modal loss is also dependent upon the total thickness of the upper cladding layer, for example, 33 in FIG. 4. FIG. 6 is a graph showing the modal loss as a function of the thickness of the p-type upper cladding layer. As will be observed as the thickness is reduced to about 0.6 $\mu$m or less, the loss greatly increases because of the band-to-band optical absorption associated with the GaAs cap layer (35 in FIG. 4). This additional absorption in a thin-cladding-layer laser causes the threshold to be increased, accompanied by a blue-shift of the lasing wavelength. This loss mechanism, therefore, can be the basis for another variant of the two-wavelength array based on the quantum well bandfilling.

Figure 7:
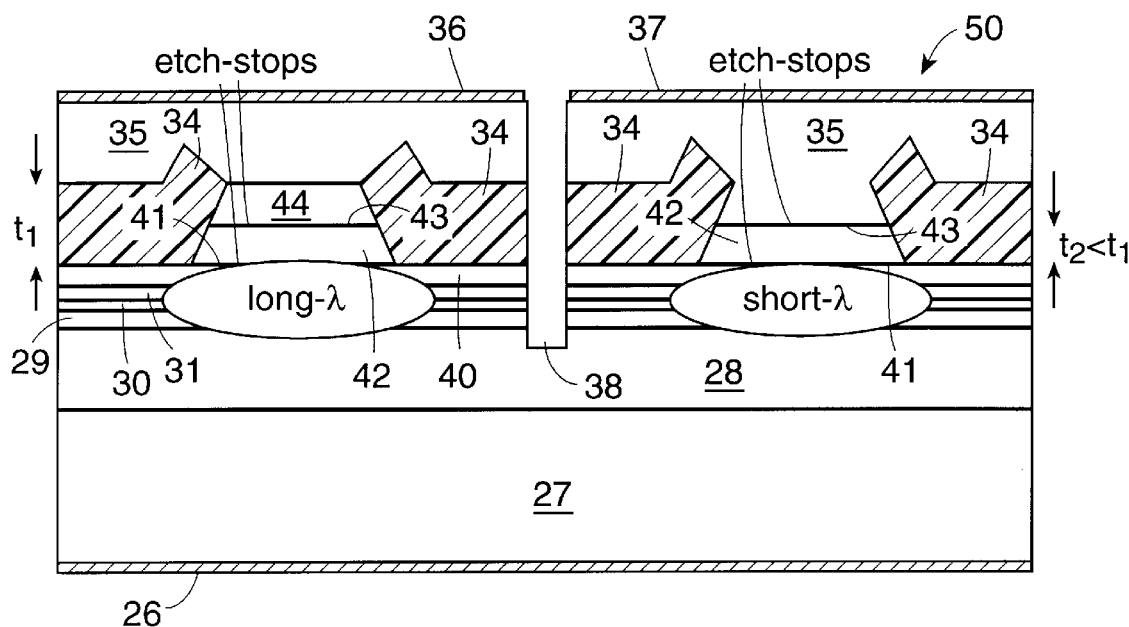
FIG. 7 is a cross-sectional schematic view of one form of multiple wavelength laser array employing the effect illustrated in FIG. 6.

One form of such an array using the effect illustrated in FIG. 6 is shown in FIG. 7 at 50. The initial epitaxial layers 28, 29, 30, 31, 40, 41, 42, 43, 44 are very similar to those in FIG. 5, where two etch-stop layers 41, 43 are included in the upper cladding layer 42, 44 of the structure. In contrast to the array in FIG. 5, however, the bottom etch-stop 41 serves to define the depth to which both ridges are etched, with the bottom of the ridge the same distance from the active region 29–31 for each device. The top etch-stop layer 43 is included to facilitate thinning of one of the ridges. For example, in FIG. 7, the p-cladding layer of the right-hand laser ridge has been etched down to the top etch stop 43. Since the p-cladding layer is thinner in this device, its modal loss will be greater (see FIG. 6), leading to higher threshold current and shorter wavelength. Note that when the upper cladding 42 is thin, the p-cap 35 is located much closer to the active region, and increased optical absorption arising from the p-GaAs contact 35 raises the laser's threshold and blue shifts its wavelength.

An example fabrication procedure for the array of FIG. 7 is as follows:

1. Epitaxial wafer growth of an $(AlGa)_{0.5}In_{0.5}P$ quantum well laser, with two etch-stops 41, 43 in the upper cladding layer 40, 42, 44. The etch stops could be, for example, thin GaAs or GaInP for the top etch stop 43 (displaced roughly 0.4–0.7 $\mu$m from the active region), and GaInP or AlGaAs (so as to be optically transparent) for the lower etch-stop 41 (0.1–0.4 $\mu$m from the active region).

2. Deposition of a dielectric etch/regrowth mask (not shown) (usually $SiO_2$ or $Si_3N_4$) and patterning into stripes.

3. Etching of ridges. Both ridges left and right, are etched to the bottom etch stop 41. Therefore, the etch must proceed through the top etch stop 43, and terminate at the bottom etch stop. This etching could be simplified if the top etch stop were GaAs, while the lower etch stop is GaInP (the usual case). In this case, selective etches (for example 5 $H_2SO_4:H_2O_2:H_2O$ for AlGaAs, and HCl:3 $H_2O$ for AlGaInP) could be used to accomplish a highly controlled etching sequence.

4. Selective growth of n-type GaAs 34 around each ridge.

5. Masking the left-hand laser (not shown).

6. Selective etching of the p-cladding layer 44 of the right-hand laser. By using a selective etch such as HCl:3 $H_2O$, the regrown GaAs remains intact, while etching the right-hand ridge to the top etch-stop 43.

7. Regrowth of p-type GaAs 35 over the whole wafer.

8. Etching of an isolation groove 38 between the two side-by-side laser elements of the array.

9. Metallization 26, 36, 37.

10. Cleaving, facet-coating, dicing, and packaging in the usual way.

Figure 8:
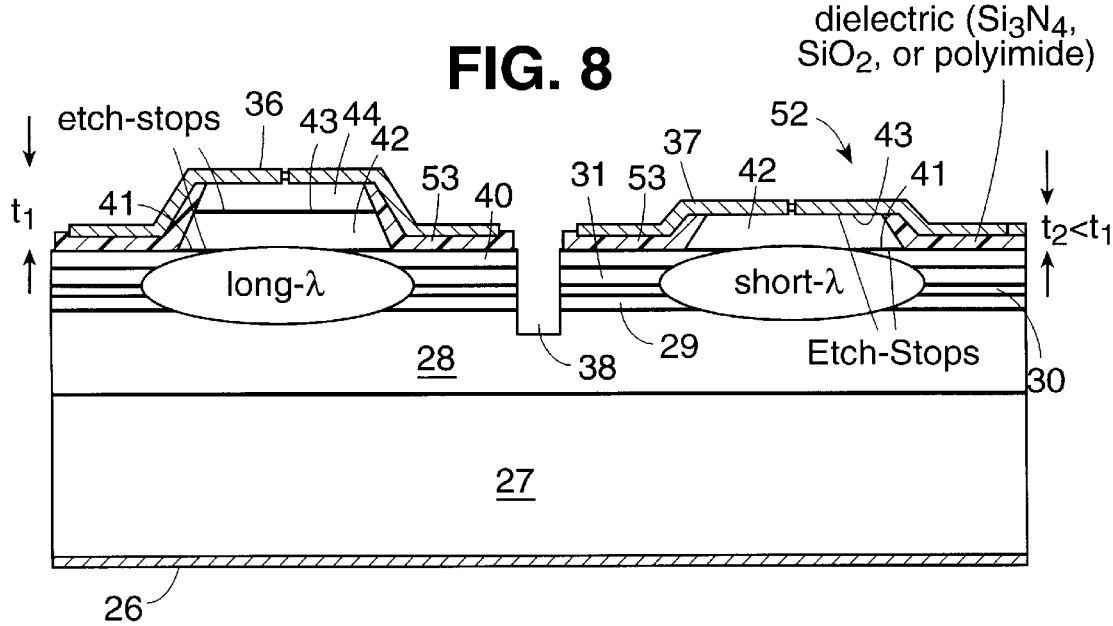
FIG. 8 is a cross-sectional schematic view of another form of multiple wavelength laser array employing the effect illustrated in FIG. 6.

Another, similar and functionally equivalent laser array 52 is shown in FIG. 8. In this example, each device is a bare ridge waveguide (not a selectively-buried ridge waveguide as in the previous examples). For the right-hand laser with a thin cladding layer 42, either a regrown GaAs contact layer or the contact metal itself 37, is in relatively close proximity to the active region 29, 30, 31. Consequently, the modal loss arising from GaAs cap absorption, or optical loss associated with the p-contact metal, causes the right-hand laser to have higher threshold. Subsequently, the quantum well bandfilling must necessarily decrease the lasing wavelength. To isolate the contact layers 36, 37 from the underlying semiconductor layer 40, a dielectric layer 53 of, for example, $Si_3N_4$, $SiO_2$, or polyimide is deposited before depositing the contact layers.

In both the FIG. 7 and FIG. 8 embodiments, the upper cladding layer 42 is kept thin enough so that the evanescent wave from the emitted laser light will reach and be absorbed by a material (semiconductor 35 in FIG. 7; metal 37 in FIG. 8) thereby increasing the modal loss sufficiently to produce the desired bandfilling effect. Thus, the invention is not limited to the specific semiconductors and metals disclosed and other materials exhibiting increased absorption for the evanescent wave can be substituted.

The invention is also not limited to the semiconductor system examples given. While AlGaInP systems are preferred, the invention is also applicable to other material systems such as AlGaAs. Also, it will be recognized that the invention is not limited to structures with single QWs but also applies to multiple QW structures. As distinguished from some other solutions to the multiple wavelength laser array problem, here the active layer compositions are the same in both lasers, and reliance is placed in the examples given on modifying the geometry of the two laser regions to reduce the ridge cross-section and thus vary the outcoupling loss to the closer regrown wing regions, cap layers or contact layers to blue shift the operating wavelength in comparison with that of the relatively larger ridge cross-section. It will also be appreciated that the invention is not limited to two side-by-side lasers but also applies to common semiconductor bodies incorporating three or more lasing regions generating radiation at two or more different wavelengths.

Not shown are the usual mirrors or facets at opposite ends of the structure to form the conventional optical cavity to support the necessary photon build-up to produce the lasing action. Further details on the manufacture of SBR type diode lasers can be found in the referenced related application and publications whose contents are incorporated herein.

While the invention has been described in conjunction with specific embodiments, it will be evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A multiple wavelength laser diode array comprising:
   (a) a common semiconductor body comprising at least first and second side-by-side diode lasers each comprising an elongated ridge region flanked by elongated wing regions to define in or below the ridge region a lasing region,
   (b) active layers of the same composition extending in the body below the wing and ridge regions wherein the active layers form a quantum well,
   (c) said wing regions being constituted of regrown semiconductor material which creates a lower modal index of refraction than that of the ridge region forming diode lasers of the SBR type,
   (d) the cross-section of the ridge region in the first laser being larger than the ridge region cross-section in the second laser, whereby the first laser operates at a longer wavelength $\lambda_1$ and the second laser operates at a shorter wavelength $\lambda_2$ due to a greater outcoupling loss to the wing regions flanking the ridge region in the second laser, and the difference between said wavelength $\lambda_1$ and the wavelength $\lambda_2$ is in the order of at least tens of nanometers, wherein the larger cross-section of the first laser ridge region is formed by a larger vertical depth $h_1$ of the first laser ridge region compared with the vertical depth $h_2$ of the second laser ridge region.

2. The multiple wavelength laser diode array of claim 1, wherein the larger cross-section of the first laser ridge region is formed by a larger lateral width $w_1$ of the first laser ridge region compared with the lateral width $w_2$ of the second laser ridge region.

3. The multiple wavelength laser diode array of claim 1, wherein the active layers are constituted of GaInP, and the ridge regions are constituted of AlGaInP.

4. The multiple wavelength laser diode array of claim 3, wherein the wing regions are of GaAs.

5. The multiple wavelength laser diode array of claim 3, wherein both $\lambda_1$ and $\lambda_2$ are in the red region of the spectrum.

6. A multiple wavelength laser diode array comprising:
   (a) a common semiconductor body comprising at least first and second side-by-side diode lasers each comprising an elongated ridge region flanked by elongated wing regions to define in or below the ridge region a lasing region,
   (b) active layers of the same composition extending in the body below the wing and ridge regions,
   (c) said wing regions being constituted of semiconductor material having a lower index of refraction than that of the ridge region,
   (d) the wing regions of the first laser being deeper in the body than the wing regions of the second laser forming a ridge region of the second laser that is shallower than that of the first laser, whereby the first laser operates at a first wavelength $\lambda_1$ and the second laser operates at a second wavelength $\lambda_2$ that is blue-shifted with respect to the first wavelength due to increased outcoupling loss in the second laser.

7. The multiple wavelength laser diode array of claim 6, wherein both lasers employ the GaInP/AlGaInP material system.

8. A multiple wavelength laser diode array comprising:
(a) a common semiconductor body comprising at least first and second side-by-side diode lasers each comprising an elongated ridge region to define in or below the ridge region a lasing region,
(b) active layers of the same composition extending in the body below the ridge regions,
(c) an upper cladding layer extending in each ridge region above the lasing region,
(d) a layer of a material having a higher optical absorption for the radiation emitted by the lasing regions compared to the optical absorption of each upper cladding layer, the higher optical absorption layer being located over at least the upper cladding layer of the second laser,
(e) the upper cladding layer of the second laser being thinner than that of the first laser such that radiation of the second laser can reach the higher optical absorption layer, whereby the first laser operates at a first wavelength $\lambda_1$ and the second laser operates at a second wavelength $\lambda_2$ that is blue-shifted with respect to the first wavelength due to increased modal loss in the second laser.

9. The multiple wavelength laser diode array of claim 8, wherein both lasers employ the GaInP/AlGaInP material system.

10. The array of claim 9, wherein the layer of claim element (d) is a p-type semiconductor layer.

11. The array of claim 10, wherein the layer of claim element (d) is GaAs.

12. The array of claim 8, wherein the layer of claim element (d) is a metal contact layer.

13. The array of claim 8, wherein the upper cladding layer in the second layer is p-type and is less than about 0.6 µm thick.

* * * * *